(12) United States Patent
Yamabana et al.

(10) Patent No.: US 7,863,939 B2
(45) Date of Patent: Jan. 4, 2011

(54) SIGNAL DETECTING APPARATUS, SIGNAL RECEIVING APPARATUS, AND SIGNAL DETECTING METHOD

(75) Inventors: Tetsuji Yamabana, Kawasaki (JP); Satoshi Ide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 25 days.

(21) Appl. No.: 12/320,592

(22) Filed: Jan. 29, 2009

(65) Prior Publication Data

US 2009/0289664 A1 Nov. 26, 2009

(30) Foreign Application Priority Data

May 23, 2008 (JP) .............................. 2008-135347

(51) Int. Cl.
*H03K 5/153* (2006.01)
(52) U.S. Cl. .............................. 327/58; 327/62; 327/18
(58) Field of Classification Search ............. 327/58–60, 327/62, 77, 18–21
See application file for complete search history.

(56) References Cited

U.S. PATENT DOCUMENTS

| 3,824,464 A | * | 7/1974 | Rotier et al. ................. 368/118 |
| 4,686,390 A | * | 8/1987 | Cleary et al. ................... 327/58 |
| 5,555,452 A | * | 9/1996 | Callaway et al. .......... 455/226.2 |
| 6,064,238 A | * | 5/2000 | Wight et al. ................... 327/58 |
| 7,436,906 B2 | * | 10/2008 | Goto ........................... 375/316 |

FOREIGN PATENT DOCUMENTS

| JP | 09-261296 | 10/1997 |
| JP | 2000-115218 | 4/2000 |
| JP | 2001-024681 | 1/2001 |

* cited by examiner

*Primary Examiner*—Long Nguyen
(74) *Attorney, Agent, or Firm*—Staas & Halsey LLP (57) ABSTRACT

A signal detecting apparatus detects a signal received based on a current received and includes a detecting unit that detects, in the current received, a peak equal to or higher than a threshold and a time counting unit that counts a given period of time from a point in time of detection of the peak by the detecting unit. The signal detecting apparatus further includes a determining unit that determines whether the detecting unit has detected the peak again within the given period of time counted by the time counting unit. An output unit of the signal detecting apparatus outputs information indicating detection of the signal received when the determining unit determines that the peak has been detected again.

7 Claims, 7 Drawing Sheets

SIGNAL DETECTING APPARATUS, SIGNAL RECEIVING APPARATUS, AND SIGNAL DETECTING METHOD

CROSS REFERENCE TO RELATED APPLICATIONS

This application is based upon and claims the benefit of priority from the prior Japanese Patent Application No. 2008-135347, filed on May 23, 2008, the entire contents of which are incorporated herein by reference.

FIELD

The embodiment discussed herein is related to a signal detecting apparatus that detects a signal, a signal receiving apparatus, and a signal detecting method.

BACKGROUND

Passive optical networks (PONs) have been used conventionally. In PONs, a branching apparatus is inserted in an optical fiber network to branch a single optical fiber to plural subscribers. An optical line terminal (OLT) at a station in a PON receives burst optical signals transmitted intermittently from optical network units (ONUs) of subscribers via a star coupler.

When an OLT detects a burst optical signal, a method using a peak detecting circuit and a comparator is commonly performed (see, e.g., Japanese Laid-Open Patent Application No. 2000-115218). The peak detecting circuit outputs a peak current representing a peak of a current received at the OLT. The comparator compares output from the peak detecting circuit with an SIGDET threshold. When the result of comparison by the comparator indicates that the output from the peak detecting circuit is equal to or higher than the SIGDET threshold, a signal is detected by the OLT.

The conventional technique above, however, poses a problem in that erroneous detection of a signal during a state of no signal reception may occur if no signal is received for a long period. Specifically, because the peak detecting circuit is a kind of an integrating circuit that remains irreversible unless reset (i.e., circuit with no output decrease), output from the peak detecting circuit rises gradually due to noise even during a state of no signal reception. The longer the state of no signal reception, the greater the possibility that output from the peak detecting circuit will exceed the SIGDET threshold. Therefore, if a signal is not received for a long period, output from the peak detecting circuit exceeds the SIGDET threshold, resulting in erroneous signal detection.

SUMMARY

According to an aspect of an embodiment, a signal detecting apparatus that detects a signal received based on a current received includes a detecting unit that detects, in the current received, a peak equal to or higher than a threshold; a time counting unit that counts a given period of time from a point in time of detection of the peak by the detecting unit; a determining unit that determines whether the detecting unit has detected the peak again within the given period of time counted by the time counting unit; and an output unit that outputs information indicating detection of the signal received when the determining unit determines that the peak has been detected again.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Preferred embodiments of the present invention will be explained with reference to the accompanying drawings.

Figure 1:
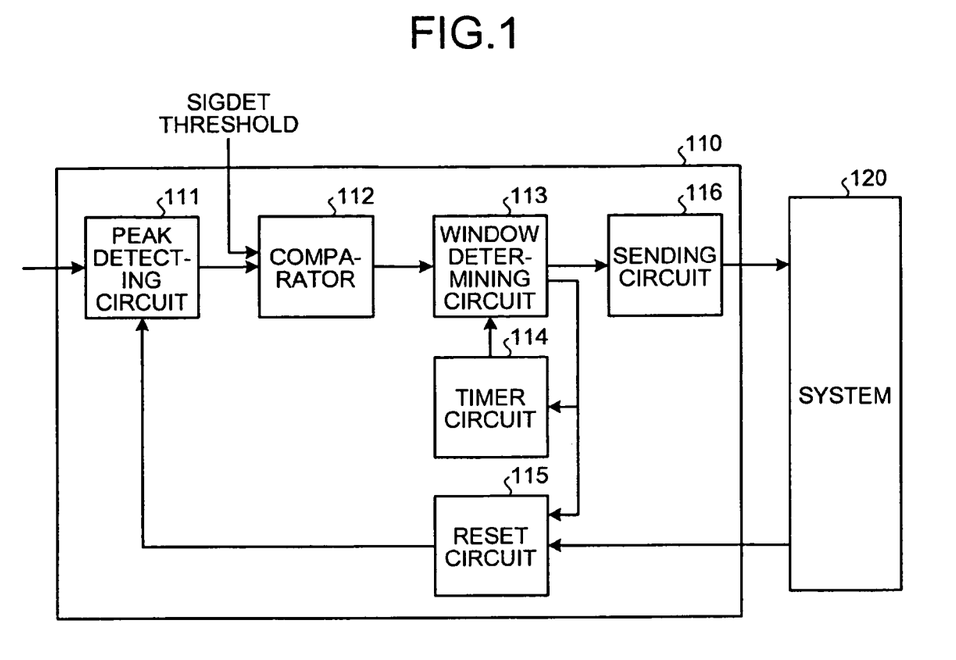
FIG. 1 is a functional diagram of a signal detecting apparatus according to an embodiment.

FIG. 1 is a functional diagram of a signal detecting apparatus according to an embodiment. As depicted in FIG. 1, a signal detecting apparatus 110 of the embodiment includes a peak detecting circuit 111, a comparator 112, a window determining circuit 113, a timer circuit 114, a reset circuit 115, and a sending circuit 116.

The signal detecting apparatus 110 receives input of a burst signal via a transmission path, including noise generated on the transmission path. Hereinafter, a burst signal and noise input to the signal detecting apparatus 110 are collectively referred to as "current received". The signal detecting apparatus 110 is a detecting apparatus that detects a burst signal based on a current received.

The detecting circuit 111 and the comparator 112 constitute a detecting unit that detects, in a current received, a peak equal to or higher than a threshold. The peak detecting circuit 111 detects a peak of an input current. Specifically, the peak detecting circuit 111 outputs, to the comparator 112, a peak current that represents the maximum of the current received during a period from an initial state to the present.

The peak detecting circuit 111 receives input of a reset signal output from the reset circuit 115. Upon receiving the input reset signal, the peak detecting circuit 111 resets the peak current to zero. After resetting the peak current, the peak detecting circuit 111 outputs, to the comparator 112, a peak current that represents the maximum of the current received during a period from the resetting to the present.

The comparator 112 receives input of an SIGDET threshold from an external source and the peak current from the peak detecting circuit 111. The comparator 112 outputs, to the window determining circuit 113, a comparison signal that indicates whether a peak current from the peak detecting circuit 111 is at least equal to the SIGDET threshold. Specifically, the comparator 112 turns off the comparison signal when the peak current is below the SIGDET threshold, and turns on the comparison signal when the peak current is at least equal to the SIGDET threshold.

The window determining circuit 113 is a determining unit that determines whether the peak detecting circuit 111 and the comparator 112 subsequently detect a peak equal to or higher than the SIGDET threshold during a given period after the detecting circuit 111 and comparator 112 have detected a peak equal to or higher than the SIGDET threshold. The window determining circuit 113 determines the present moment to be within the given period when a window signal from the timer circuit 114 is on, and determines the present moment to be outside the given period when the window signal is off.

When a comparison signal from the comparator 112 turns on at a time outside the given period, the window determining circuit 113 outputs a trigger signal to the timer circuit 114 and the reset circuit 115. When the comparison signal output from the comparator 112 turns on at a time within the given period, the window determining circuit 113 outputs a detection signal to the sending circuit 116.

The timer circuit 114 is the time counting unit that counts the given period of time from the point of detection of a peak equal to or higher than the SIGDET threshold by the peak detecting circuit 111 and the comparator 112. Upon receiving a trigger signal output from the window determining circuit 113, the timer circuit 114 counts the given period of time from the point of reception of the trigger signal. During counting of the given period of time, the timer circuit 114 turns on a window signal output to the window determining circuit 113. When not counting the given period of time, the timer circuit 114 turns off the window signal output to the window determining circuit 113.

Upon receiving a trigger signal output from the window determining circuit 113 or from a system 120, the reset circuit 115 outputs a reset signal to the peak detecting circuit 111. Upon receiving a detection signal from the window determining circuit 113, the sending circuit 116 sends information indicative of detection of a signal in the current received, to the system 120.

Figure 2:
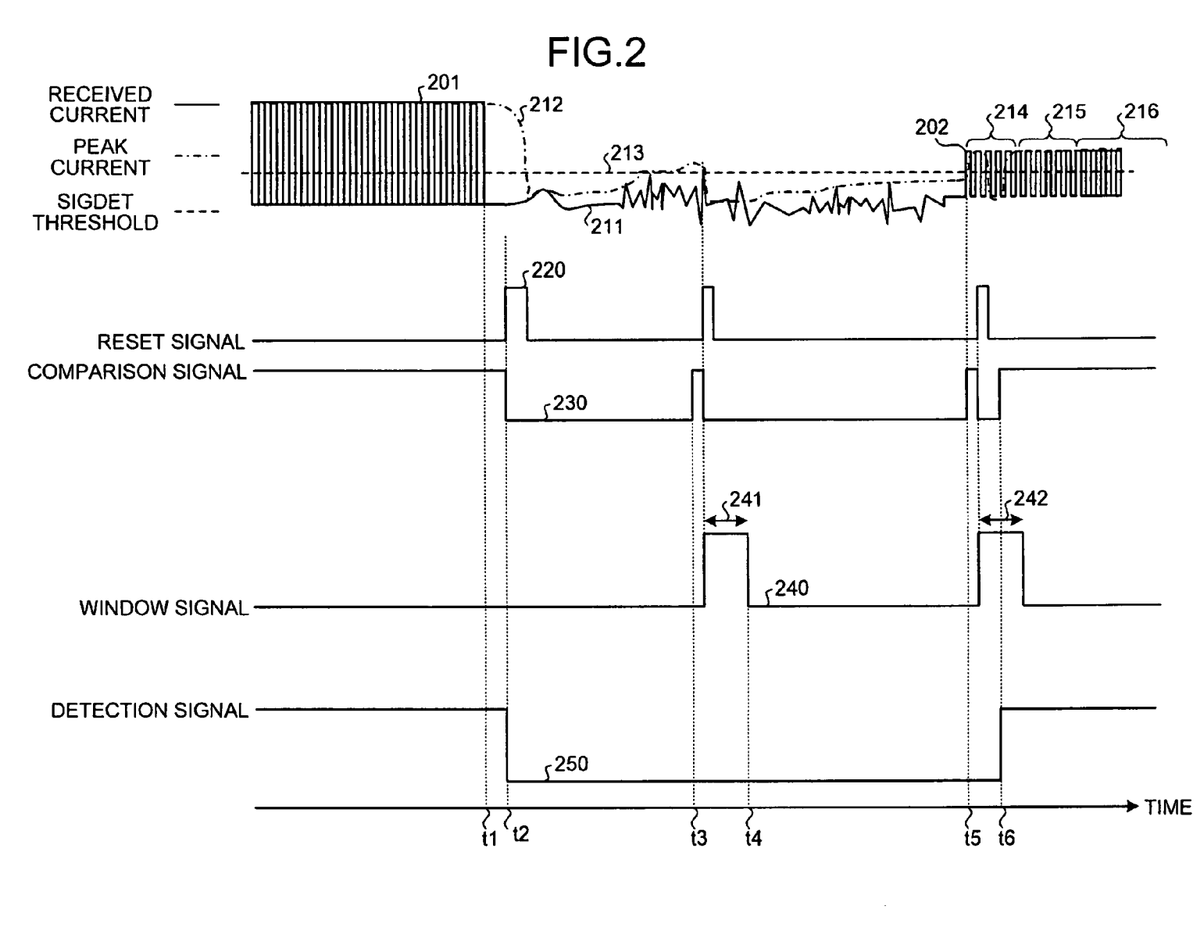
FIGS. 2 to 4 depict examples of a time chart of input/output to/from each block depicted in FIG. 1.

FIG. 2 depicts an example of a time chart of input/output to/from each block depicted in FIG. 1. In FIG. 2, the horizontal axis represents a time axis common to the input/output. Reference numeral 211 (solid line) denotes a current (current received) input to the peak detecting circuit 111. Reference numeral 212 (chain line) denotes a peak current output from the peak detecting circuit 111 to the comparator 112. Reference numeral 213 (dotted line) denotes the SIGDET threshold input to the comparator 112. In the case depicted in FIG. 2, an interval of a given time (t1 to t5) occurs between a burst signal 201 as a received signal and a burst signal 202 received next.

Reference numeral 220 denotes a reset signal that is output from the reset circuit 115 to the peak detecting circuit 111. Reference numeral 230 denotes a comparison signal that is output from the comparator 112 to the window determining circuit 113. Reference numeral 240 denotes a window signal that is output from the timer circuit 114 to the window determining circuit 113. Reference numeral 250 denotes a detection signal that is output from the window determining circuit 113 to the sending circuit 116.

On the time axis, a period before a time t1 represents a period during which the burst signal 201 is received, as indicated by reference numeral 211. At a time t2 (after the time t1), a trigger signal is output from the system 120 to the reset circuit 115. Consequently, as indicated by the reference numeral 220, the reset signal is output from the reset circuit 115 to the peak detecting circuit 111, thereby resetting the peak current, as indicated by reference numeral 212.

During a period between the time t2 and a time t3 (after the time t2), the peak current remains lower than the SIGDET threshold, as indicated by reference numerals 212 and 213, and therefore, the comparison signal remains off, as indicated by the reference numeral 230. At the time t3, the peak current becomes equal to or higher than the SIGDET threshold, thereby causing the comparison signal to be turned on, as indicated by the reference numeral 230.

At the time t3, because the window signal output from the timer circuit 114 is off at this point in time, the window determining circuit 113 outputs a trigger signal to the timer circuit 114 and the reset circuit 115. In response, the timer circuit 114 turns on the window signal output to the window determining circuit 113 during a period 241 (given period) from the point of reception of the trigger signal from the window determining circuit 113, as indicated by the reference numeral 240.

Upon receiving the trigger signal from the window determining circuit 113, the reset circuit 115 outputs the reset signal to the peak detecting circuit 111, as indicated by the reference numeral 220, thereby resetting the peak current, as indicated by the reference numeral 212. In this case, as indicated by the reference numerals 212 and 213, the peak current does not become equal to or higher than the SIGDET threshold during the period 241 after the peak current has been reset. At a time t4 at which the period 241 has elapsed, the timer circuit 114 turns off the window signal output to the window determining circuit 113.

During a period between the time t4 and a time t5 (after the time t4), the peak current remains lower than the SIGDET threshold, as indicated by reference numerals 212 and 213, and therefore, the comparison signal remains off, as indicated by the reference numeral 230. At the time t5, the burst signal 202 is received. Reference numerals 214, 215, and 216 denote a preamble segment, a delimiter segment, and a payload segment of the burst signal 202, respectively.

At the time t5, the peak current becomes equal to or higher than the SIGDET threshold, thereby causing the comparison signal to be turned on, as indicated by the reference numeral 230. At the time t5, because the window signal output from the timer circuit 114 is off at this point in time, the window determining circuit 113 outputs a trigger signal to the timer circuit 114 and to the reset circuit 115. In response, the timer circuit 114 turns on the window signal output to the window determining circuit 113 during a period 242 (given period) from the point of reception of the trigger signal, as indicated by the reference numeral 240.

Upon receiving the trigger signal, the reset circuit 115 outputs the reset signal to the peak detecting circuit 111, as indicated by the reference numeral 220. This resets the peak current, as indicated by the reference numeral 212. At this time, because the preamble segment 214 of the burst signal 202 is currently received, the peak current reset at the time t5 rises to become equal to or higher than the SIGDET threshold again at a time t6 during the period 242.

At the time t6, because the window signal output from the timer circuit 114 is on at this point in time, the window determining circuit 113 outputs the detection signal to the sending circuit 116, as indicated by the reference numeral 250. As a result, the sending circuit 116 sends information indicating detection of a signal in the current received, to the system 120.

The given period of time counted by the timer circuit 114 is set to be sufficiently long. For example, the period 242 is set to be sufficiently long so that the peak current exceeds the SIGDET threshold twice during reception of the preamble segment 214. In addition, the time constant of the peak detecting circuit 111 is set to be sufficiently high so that output from peak detecting circuit 111 exceeds the SIGDET threshold again during the period 242. As a result, the burst signal 202 is detected before reception of the payload segment 216 to ensure reception of the payload segment 216.

A given period is set to be sufficiently short. For example, the period 241 is set to be sufficiently short so that the peak current does not exceed the SIGDET threshold again in the period 241 due to noise in a state of no signal reception, thereby reducing the possibility of erroneous signal detection during a state of no signal reception.

Figure 3:
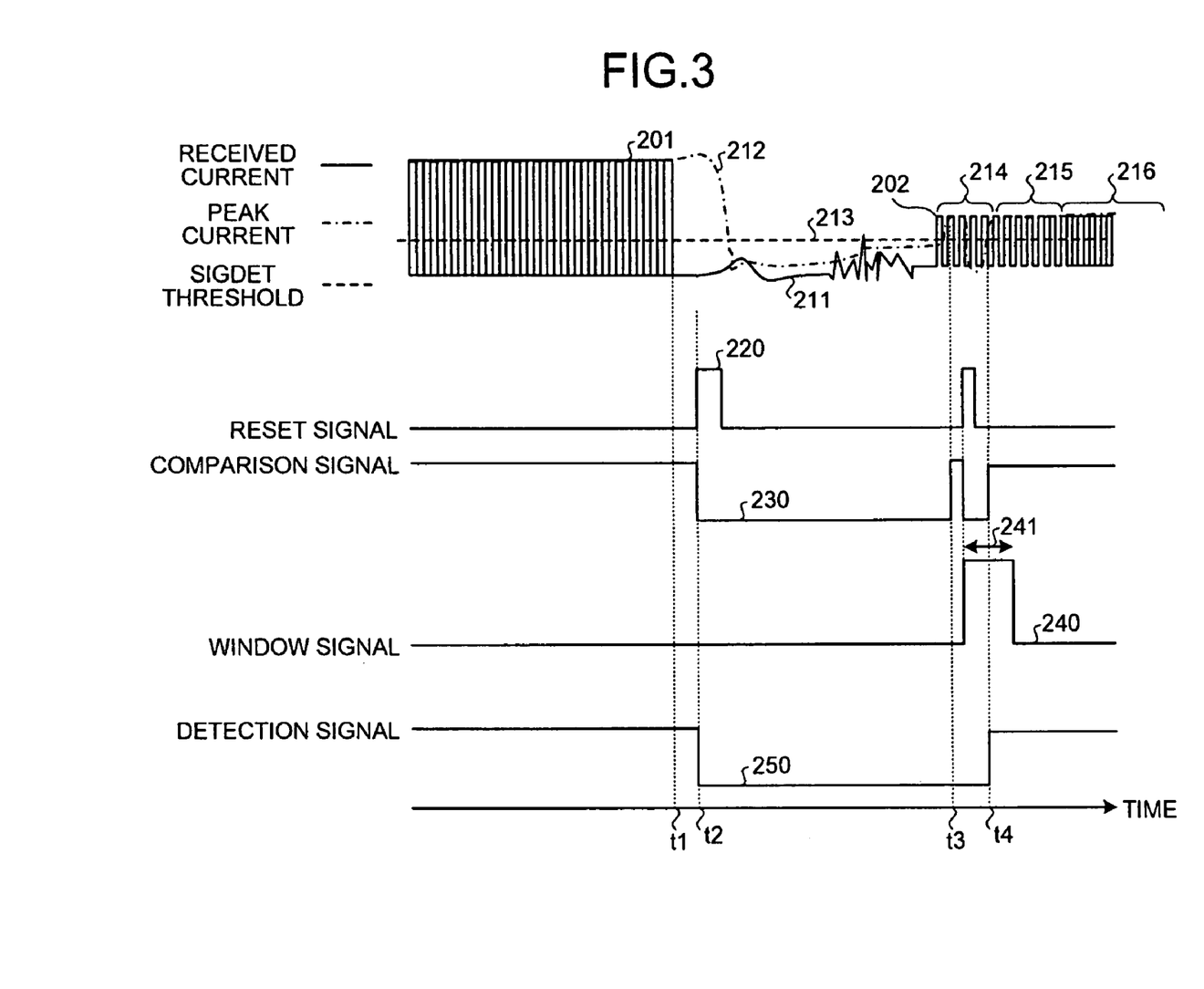

FIG. 3 depicts another example of a time chart of input/output to/from each of the blocks depicted in FIG. 1. In FIG. 3, constituent elements identical to those described in FIG. 2 are indicated respectively by identical reference numerals, and are omitted in further description. In the case depicted in FIG. 3, the interval between receptions of burst signals is shorter than the interval of reception of burst signals depicted in FIG. 2. In the case depicted in FIG. 3, an interval of a given time (t1 to t3) occurs between the burst signal 201 as the signal received and the burst signal 202 received next. After the passage of the time t2, the next burst signal 202 is received at the time t3 before the peak current becomes equal to or higher than the SIGDET threshold due to accumulating noises in the current received.

At the time t3, because the window signal output from the timer circuit 114 is off at this point in time, the window determining circuit 113 outputs a trigger signal to the timer circuit 114 and the reset circuit 115. In response, the timer circuit 114 turns on the window signal output to the window determining circuit 113 during the period 241 (given period) from the point in time of reception of the trigger signal, as indicated by the reference numeral 240.

Upon receiving the trigger signal, the reset circuit 115 outputs the reset signal to the peak detecting circuit 111, as indicated by the reference numeral 220. This resets the peak current, as indicated by the reference numeral 212. At this time, because the preamble segment 214 of the burst signal 202 is currently received, the peak current reset at the time t3 rises to become equal to or higher than the SIGDET threshold again at the time t4 in the period 241.

At the time t4, because the window signal output from the timer circuit 114 is on at this point in time, the window determining circuit 113 outputs the detection signal to the sending circuit 116, as denoted by the reference numeral 250. As a result, the sending circuit 116 sends information indicating detection of a signal in the current received, to the system 120. In this manner, when an interval between receptions of burst signals is short, the signal may be detected by the first window determination.

Figure 4:
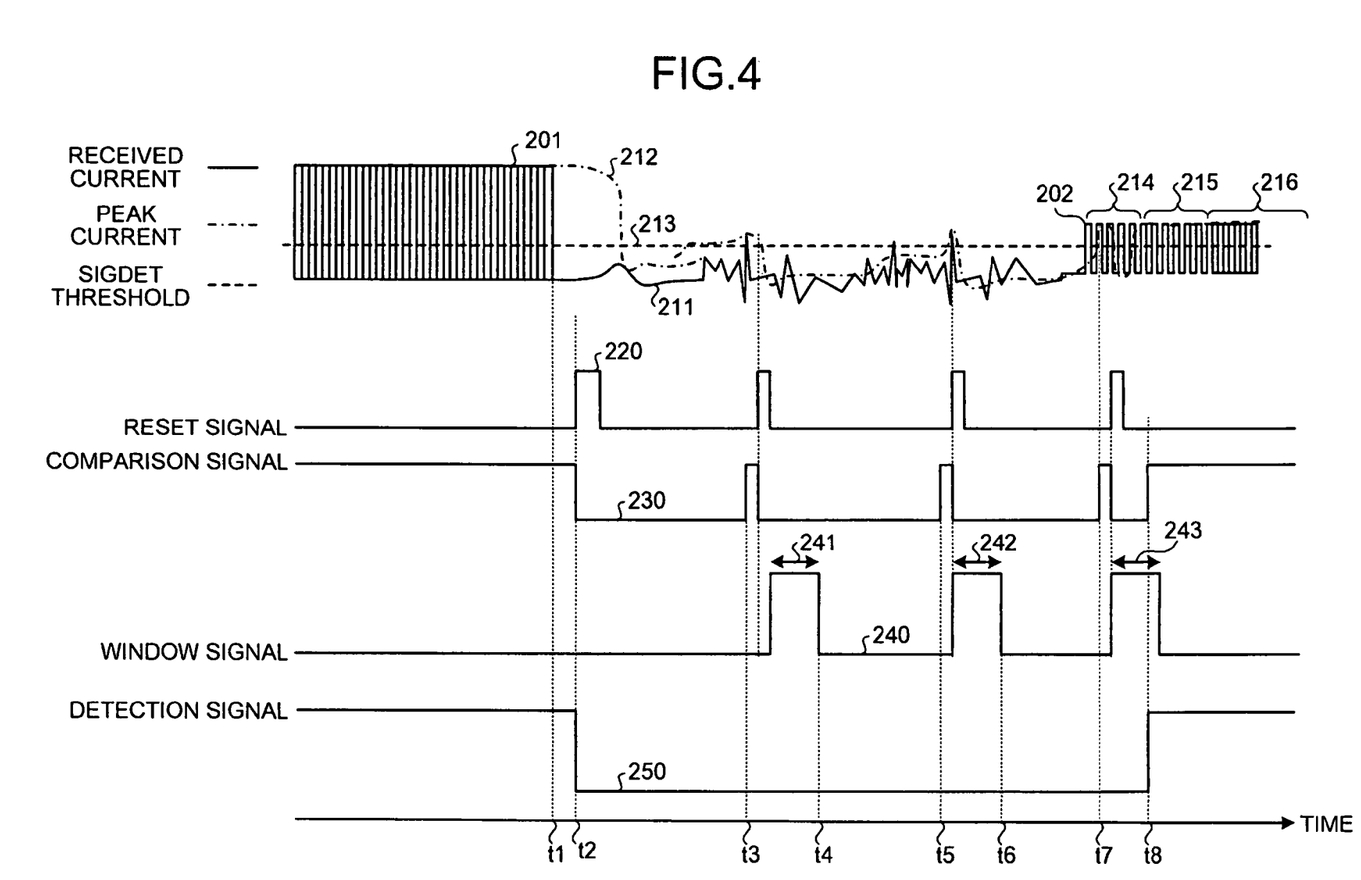

FIG. 4 depicts another example of a time chart of input/output to/from each of the blocks depicted in FIG. 1. In FIG. 4, constituent elements identical to those described in FIG. 2 are indicated respectively by identical reference numerals, and are omitted in further description. In the case depicted in FIG. 4, the interval between the receptions of burst signals is longer than the interval between the receptions of burst signals depicted in FIG. 2. In the case depicted in FIG. 4, an interval of a given time (t1 to t7) occurs between the burst signal 201 as the received signal and the burst signal 202 received next. Here, a burst signal is not received at the time t5, but the burst signal 202 is received at the time t7 after the passage of the period 242.

At the time t7, because the window signal output from the timer circuit 114 is off at this point in time, the window determining circuit 113 outputs a trigger signal to the timer circuit 114 and to the reset circuit 115. In response, the timer circuit 114 turns on the window signal output to the window determining circuit 113 during a period 243 (given period) from the point of reception of the trigger signal, as indicated by the reference numeral 240.

Upon receiving the trigger signal, the reset circuit 115 outputs the reset signal to the peak detecting circuit 111, as indicated by the reference numeral 220. This resets the peak current, as indicated by the reference numeral 212. At this time, because the preamble segment 214 of the burst signal 202 is currently received, the peak current reset at the time t7 rises to become equal to or higher than the SIGDET threshold again at a time t8 in the period 243.

At the time t8, because the window signal output from the timer circuit 114 is on at this point in time, the window determining circuit 113 outputs the detection signal to the sending circuit 116, as denoted by the reference numeral 250. As a result, the sending circuit 116 sends information indicating detection of a signal in the reception current, to the system 120. In this manner, when an interval between the receptions of burst signals is long, window determination is performed repeatedly until a burst signal is received.

Figure 5:
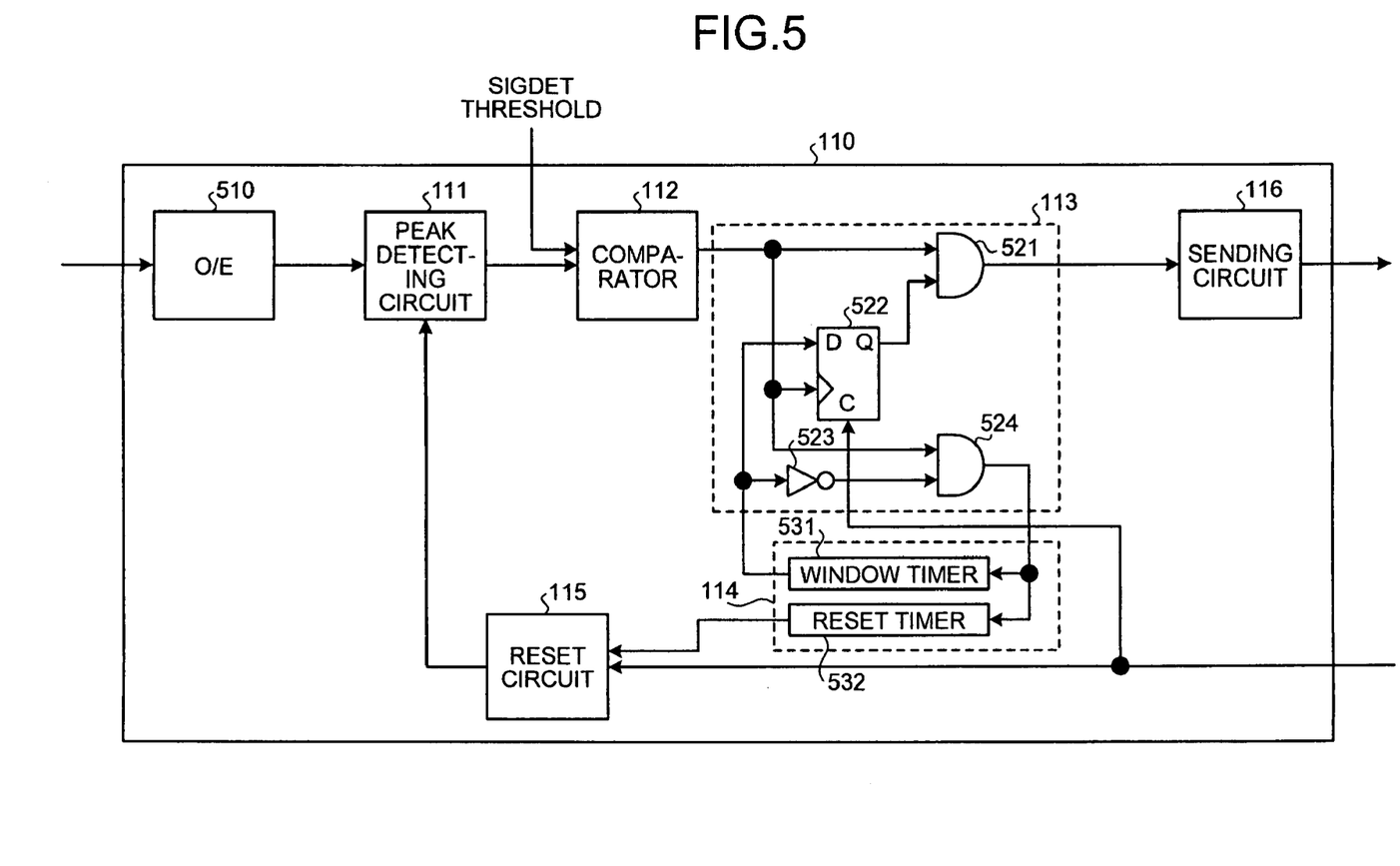
FIG. 5 is a block diagram of a specific exemplary configuration of the signal detecting apparatus depicted in FIG. 1.

FIG. 5 is a block diagram of a specific exemplary configuration of the signal detecting apparatus depicted in FIG. 1. In FIG. 5, constituent elements identical to those described in FIG. 1 are indicated respectively by identical reference numerals, and are omitted in further description. The signal detecting apparatus 110 depicted in FIG. 5 is an apparatus that detects reception of a burst optical signal. The signal detecting apparatus 110 includes an optoelectrical conversion unit 510 (O/E), in addition to the constituent elements depicted in FIG. 1.

The optoelectrical conversion unit 510 receives a burst optical signal and noise via a transmission path. The optoelectrical conversion unit 510 converts the received light into a current and outputs the current to the peak detecting circuit 111. The optoelectrical conversion unit 510 is provided as, for example, a photodiode (PD). The peak detecting circuit 111 detects, in the current output from the optoelectrical conversion unit 510, a peak equal to or higher than a threshold.

The window determining circuit 113 includes a multiplying circuit 521, a D-type flip-flop circuit 522, an inverting circuit 523, and a multiplying circuit 524. The multiplying circuit 521 receives input of a comparison signal from the comparator 112 and input of output from an output terminal Q of the flip-flop circuit 522. The multiplying circuit 521 outputs, as a detection signal to the sending circuit 116, the result of multiplying the comparison signal from the comparator 112 and the output from the flip-flop circuit 522.

A window signal from the timer circuit 114 is input to an input terminal D of the flip-flop circuit 522, which latches the window signal input to the input terminal D. A comparison signal from the comparator 112 is input to a trigger of the flip-flop circuit 522. The output terminal Q of the flip-flop circuit 522 is connected to the multiplying circuit 521.

When the comparison signal output from the comparator 112 to the trigger turns on when the window signal output from the timer circuit 114 to the input terminal D is on, the flip-flop circuit 522 turns on output from its output terminal Q. An external reset signal (e.g., from the system 120 depicted in FIG. 1) is input to a C terminal of the flip-flop circuit 522.

A window signal from the timer circuit 114 is input to the inverting circuit 523, which inverts and outputs the window signal to the multiplying circuit 524. A comparison signal output from the comparator 112 and the inverted signal from the inverting circuit 523 are input to the multiplying circuit 524, which outputs, as a trigger signal to the timer circuit 114, the result of multiplying the input comparison signal and the inverted signal input.

The timer circuit 114 has a window timer 531, and a reset timer 532. A trigger signal from the multiplying circuit 524 is input to the window timer 531, whose output terminal is connected to the inverting circuit 523 and to the input terminal D of the flip-flop circuit 522. When an input trigger signal turns on, the window timer 531 keeps output high (i.e., turning on a window signal) to the inverting circuit 523 and to the flip-flop circuit 522 for a given period, and then lowers the output (i.e., turns off the window signal).

An output current from the multiplying circuit 524 is input to the reset timer 532, whose output terminal is connected to the reset circuit 115. When an input trigger signal goes high, the reset timer 532 keeps output high (i.e., outputs a trigger signal) to the reset circuit 115 for a given period, and then lowers the output (i.e., stops outputting the trigger signal).

The operation of each circuit will be described with respect to the case depicted in FIG. 2 as an example. At the time t2, the comparison signal output from the comparator 112 turns off, so that the detection signal output from the multiplying circuit 521 and a trigger signal output from the multiplying circuit 524 turn off. Consequently, each input to the input terminal D and the trigger of the flip-flop circuit 522, to the window timer 531, to the reset timer 532, and to the inverting circuit 523 also turns off, thereby turning off output from the output terminal Q of the flip-flop circuit 522 and turning on the inverted signal from the inverting circuit 523.

Then, at the time t3, the comparison signal from the comparing circuit 112 turns on. As a result, input to the trigger of the flip-flop circuit 522 turns on; however, as the input to the input terminal D of the flip-flop circuit 522 is off, output from the output terminal Q of the flip-flop-circuit 522, therefore, remains off. As a result, the detection signal from the multiplying circuit 521 remains off.

Meanwhile, the two input to the multiplying circuit 524 turn on, which turns on a trigger signal output from the multiplying circuit 524. As a result, output from the window timer 531 and from the reset timer 532 turn on. Consequently, the input to the input terminal D of the flip-flop circuit 522 and to the inverting circuit 523 also turn on.

Therefore, the inverted signal output from the inverting circuit 523 to the multiplying circuit 524 turns off. Further, because the reset circuit 115 resets the peak current, the comparison signal from the comparator 112 turns off. As a result, the comparison signal input to the multiplying circuit 521, to the trigger of the flip-flop circuit 522, and to the multiplying circuit 524 turns off. Subsequently, at the time t4, output from the window timer 531 turns off, thereby turning off input to the input terminal D of the flip-flop circuit 522.

Then, at the time t5, the comparison signal from the comparator 112 turns on. As a result, input to the trigger of the flip-flop circuit 522 turns on; however, as input to the input terminal D of the flip-flop circuit 522 is off, output from the output terminal Q of the flip-flop circuit 522, therefore, remains off. As a result, the detection signal from the multiplying circuit 521 remains off.

Meanwhile, the two input to the multiplying circuit 524 turn on, thereby turning on a trigger signal output from the multiplying circuit 524. As a result, output from the window timer 531 and from the reset timer 532 turn on. Consequently, the input to the input terminal D of the flip-flop circuit 522 and to the inverting circuit 523 also turn on.

Therefore, current output from the inverting circuit 523 to the multiplying circuit 524 turns off. Meanwhile, because the reset circuit 115 resets the peak current, the comparison signal from the comparator 112 turns off. As a result, the comparison signal input to the multiplying circuit 521, to the trigger of the flip-flop circuit 522, and to the multiplying circuit 524 turns off.

Then, at the time t6, the comparison signal from the comparator 112 turns on again. As a result, input to the trigger of the flip-flop circuit 522 turns on, and input to the input terminal D of the flip-flop circuit 522 also turns on. Therefore, output from the output terminal Q of the flip-flop circuit 522 turns on, which consequently turns on the detection signal output from the multiplying circuit 521.

At this time, the comparison signal output from the comparator 112 to the multiplying circuit 524 is on; however, output from the inverting circuit 523 to the multiplying circuit 524 is off. Consequently, the trigger signal output from the multiplying circuit 524 turns off, thereby turning off output from the window timer 531 and from the reset timer 532. Hence, as the reset circuit 115 does not reset the peak current, a burst signal can be received.

Following reception of the burst signal, an external reset signal is input to the C terminal of the flip-flop circuit 522. The external reset signal sets input to the input terminal D of the flip-flop circuit 522 to off, restoring the state realized at the time t2.

Figure 6:
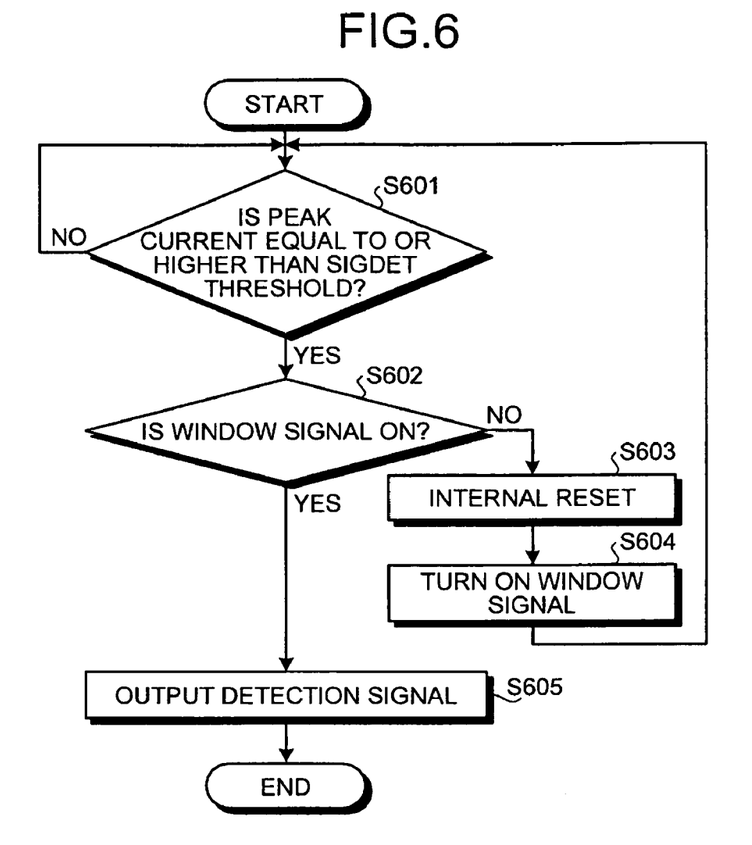
FIG. 6 is a flowchart of operation of the signal detecting apparatus depicted in FIG. 1.

FIG. 6 is a flowchart of the operation of the signal detecting apparatus depicted in FIG. 1. The signal detecting apparatus 110 depicted in FIG. 1 performs each of the following steps as hardware-based operation of each circuit. The signal detecting apparatus 110 determines first whether a peak current has become at least equal to the SIGDET threshold (step S601), and waits until the peak current becomes equal to or higher than the SIGDET threshold (step S601: NO).

When the peak current becomes equal to or higher than the SIGDET threshold (step S601: YES), whether a window signal from the timer circuit 114 is on is determined (step S602). When the window signal is off (step S602: NO), the reset circuit 115 internally resets the peak signal (step S603).

Then, the window signal from the timer circuit 114 is turned on (step S604), and the process flow returns to step S601, from which the process continues. When the window signal is on at step S602 (step S602: YES), a detection signal is output to the sending circuit 116 (step S605), ending a series of processes.

As a result of the operation above, the sending circuit 116 sends out information indicating detection of a signal in the current received. When a given period has passed after the setting of the window signal to on at step S604, the window signal is set back to off. The steps above may be performed as digital processes by a CPU, etc.

Figure 7:
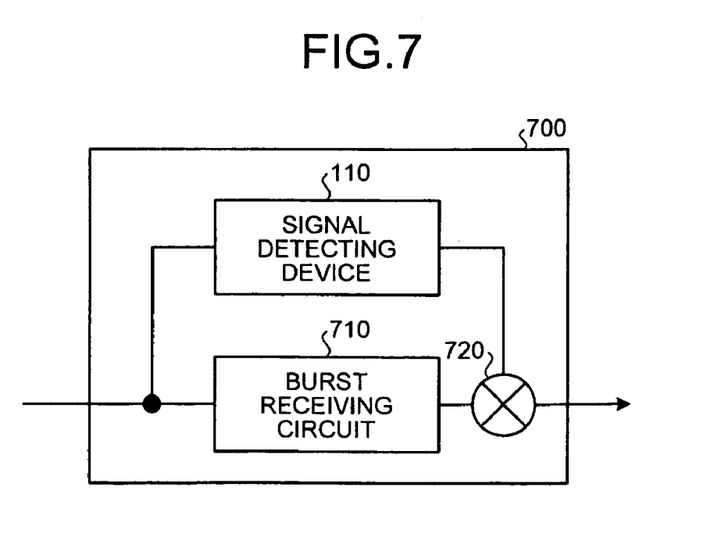
FIG. 7 is a block diagram of an optical signal receiving apparatus including the signal detecting apparatus depicted in FIG. 5.

FIG. 7 is a block diagram of an optical signal receiving apparatus including the signal detecting apparatus depicted in FIG. 5. As depicted in FIG. 7, an optical signal receiving apparatus 700 includes the signal detecting apparatus 110, a burst receiving circuit 710, and a multiplying circuit 720. The signal detecting apparatus 110 incorporated in the optical signal receiving apparatus 700 is, for example, the signal detecting apparatus 110 depicted in FIG. 5.

A burst optical signal received by the optical signal receiving apparatus 700 is input to the signal detecting apparatus 110 and to the burst receiving circuit 710. The signal detecting apparatus 110 detects the presence/absence of a received signal, based on input light. The signal detecting apparatus 110 outputs an on-signal to the multiplying circuit 720 during reception of a signal, and outputs an off-signal to the multiplying circuit 720 during no reception of a signal.

The burst receiving circuit 710 recovers data of an input burst optical signal, and outputs the recovered data to the multiplying circuit 720. The multiplying circuit (masking unit) 720 outputs the result of multiplying output from the signal detecting apparatus 110 and output from the burst receiving circuit 710. As a result, output from the burst receiving circuit 710 is output from the multiplying circuit 720 while the signal detecting apparatus 110 detects a signal.

On the contrary, output from the burst receiving circuit 710 is masked by the multiplying circuit 720 while the signal detecting apparatus 110 is not detecting a signal. The signal detecting apparatus 110 prevents erroneous signal detection when a signal is not received for a long period, thus preventing the release of masking by the multiplying circuit 720 during a state of no signal reception and malfunction during the state of no signal reception caused by noise output from the burst receiving circuit 710.

Figure 8:
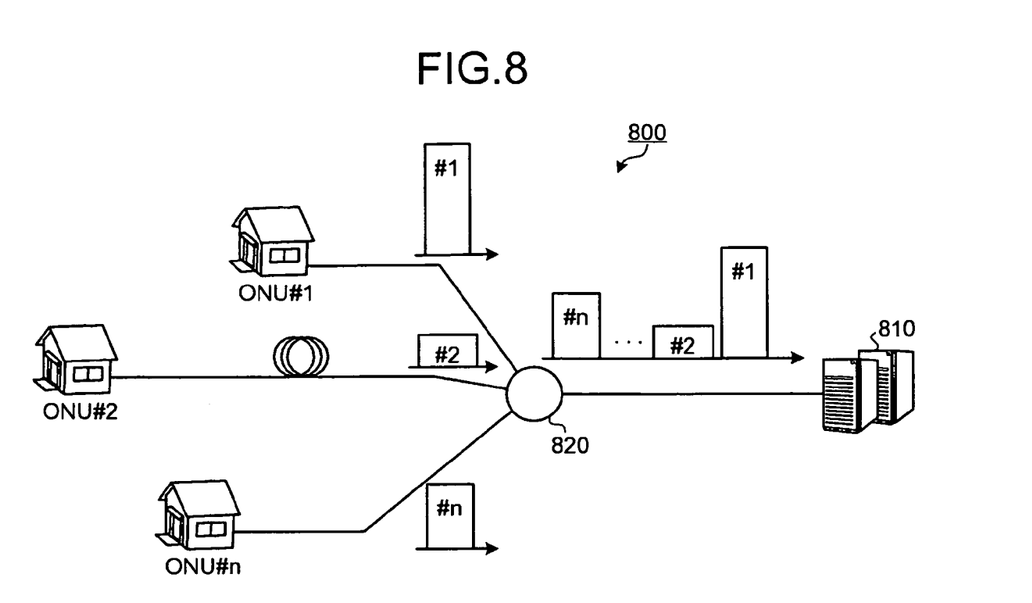
FIG. 8 is a block diagram of an optical communication system including the optical signal receiving apparatus depicted in FIG. 7.

FIG. 8 is a block diagram of an optical communication system including the optical signal receiving apparatus depicted in FIG. 7. An optical communication system 800 depicted in FIG. 8 is a PON system that includes an OLT 810, ONUs #1 to #n, and a star coupler 820. The OLT 810 and the ONUs #1 to #n are interconnected in a star formation via the star coupler 820.

The OLT 810 includes the optical signal receiving apparatus 700 depicted in FIG. 7. A burst optical signal #1 output from the ONU #1, a burst optical signal #2 output from the ONU #2, . . . , and a burst optical signal #n output from the ONU #n are time division multiplexed by the star coupler 820, and transmitted to the OLT 810.

The optical signal receiving apparatus 700 incorporated in the OLT 810 receives each burst signal transmitted intermittently from the star coupler 820. The optical signal receiving apparatus 700 can prevent malfunction that occurs when a burst signal is not received for a long period, thereby allowing the OLT 810 to receive each burst signal from the ONUs #1 to #n in a stable manner.

Because the OLT 810 of the PON system receives burst optical signals transmitted intermittently from the ONUs #1 to #n, a situation of no signal reception for a long period occurs frequently at the OLT 810. The optical signal receiving apparatus 700 incorporated in the OLT 810, however, can prevent malfunction that occurs when a burst optical signal is not received for a long period. Therefore, the optical signal receiving apparatus 700 incorporating the signal detecting apparatus 110 is particularly effective with respect to the OLT 810 of the PON system.

As described above, according to the signal detecting apparatus 110 of the embodiment, by setting a given period of time counted by the timer circuit 114, an output rise in the peak detecting circuit 111 due to noise during a state of no signal reception can be discriminated from an output rise in the peak detecting circuit 111 due to signal reception. Specifically, a rise in a peak current due to noise in a state of no signal reception is sufficiently slower than a rise in the peak current due to signal reception.

For this reason, if the given period is set properly, the peak current exceeds the SIGDET threshold again within the given period when a signal is received, while the possibility of the peak current exceeding the SIGDET threshold again within the given period is reduced sufficiently during a state of no signal reception. Hence, signal detection is performed without fail when a signal is received, and erroneous signal detection is prevented when no signal is received for a long period.

When a burst signal having a preamble segment is detected, a peak exceeding the SIGDET threshold can be detected twice while the preamble segment is being received. As a result, erroneous signal detection that occurs when a signal is not received for a long period can be avoided without affecting accuracy in reception of a payload segment of the burst signal.

As described above, according to the signal detecting apparatus, the signal receiving apparatus, and the signal detecting method disclosed herein, erroneous signal detection that occurs when a signal is not received for a long period can be prevented. In the embodiment above, the signal detecting apparatus has been described in terms of application to an OLT in a PON; however, application of the disclosed signal detecting apparatus is not limited to thereto.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A signal detecting apparatus that detects a signal received based on a current received, comprising:
   a detecting unit that detects, in the current received, a peak equal to or higher than a threshold;
   a time counting unit that counts a given period of time from a point in time of detection of the peak by the detecting unit;
   a determining unit that determines whether the detecting unit has detected the peak again within the given period of time counted by the time counting unit; and
   an output unit that outputs information indicating detection of the signal received when the determining unit determines that the peak has been detected again.

2. The signal detecting apparatus according to claim 1, wherein
   the detecting unit includes:
      a peak detecting circuit that outputs a peak current representing a maximum of the current received, and
      a comparator that compares the peak current output from the peak detecting circuit and a threshold to detect the peak, and
   the signal detecting apparatus further comprises a reset unit that resets the peak current when the detecting unit has detected the peak at a time outside the given period of time counted by the time counting unit.

3. The signal detecting apparatus according to claim 1, wherein the detecting unit detects a burst signal including a preamble segment as the signal received.

4. The signal detecting apparatus according to claim 3, wherein the time counting unit counts, as the given period of time, a period of time of a length that allows the detecting unit to detect the peak again in the preamble segment.

5. A signal receiving apparatus comprising:
   a signal detecting apparatus that detects a signal received based on a current received and includes:
      a detecting unit that detects, in the current received, a peak equal to or higher than a threshold,
      a time counting unit that counts a given period of time from a point in time of detection of the peak by the detecting unit,
      a determining unit that determines whether the detecting unit has detected the peak again within the given period of time counted by the time counting unit, and
      an output unit that outputs information indicating detection of the signal received when the determining unit determines that the peak has been detected again;
   a receiving unit that recovers data based on the current received; and
   a masking unit that outputs data recovered by the receiving unit when the output unit outputs information indicating detection of the signal received, the masking unit masking output from the receiving unit when the output unit does not output the information.

6. The signal receiving apparatus according to claim 5, wherein the signal receiving apparatus is incorporated into an optical line terminal in a passive optical network.

7. A signal detecting method of detecting a signal received based on a current received and comprising:

detecting, in the current received, a peak equal to or higher than a threshold;

counting a given period of time from a point in time of detection of the peak at the detecting;

determining whether the detecting has detected the peak again within the given period of time counted at the counting; and outputting information indicating detection of the signal received when, at the determining, the peak has been determined to have been detected again.

* * * * *